United States Patent
Tong et al.

(10) Patent No.: US 12,483,119 B2
(45) Date of Patent: Nov. 25, 2025

(54) POWER ON/OFF CONTROL CIRCUIT AND ELECTRONIC DEVICE

(71) Applicant: Mettler-Toledo Instruments (Shanghai) Co., Ltd., Shanghai (CN)

(72) Inventors: Yingzhen Tong, Shanghai (CN); Zhenhua Lin, Shanghai (CN); Xiaoling Zhou, Shanghai (CN); Jianjun Han, Shanghai (CN); Jin Tang, Shanghai (CN); Changlin Wang, Shanghai (CN)

(73) Assignee: Mettler-Toledo Instruments (Shanghai) Co., Ltd., Shanghai (CN)

( * ) Notice: Subject to any disclaimer, the term of this patent is extended or adjusted under 35 U.S.C. 154(b) by 204 days.

(21) Appl. No.: 18/565,632

(22) PCT Filed: May 31, 2022

(86) PCT No.: PCT/CN2022/096243
§ 371 (c)(1),
(2) Date: Nov. 30, 2023

(87) PCT Pub. No.: WO2022/253224
PCT Pub. Date: Dec. 8, 2022

(65) Prior Publication Data
US 2024/0258909 A1    Aug. 1, 2024

(30) Foreign Application Priority Data

Jun. 3, 2021 (CN) .......................... 202110620177.1

(51) Int. Cl.
*H02M 1/36* (2007.01)
*H02M 1/088* (2006.01)
*H02M 3/158* (2006.01)

(52) U.S. Cl.
CPC ............. *H02M 1/36* (2013.01); *H02M 1/088* (2013.01); *H02M 3/158* (2013.01)

(58) Field of Classification Search
CPC .......... H02M 1/36; H02M 1/385; H02M 1/32; H02M 1/34; H02M 1/008; H02M 1/096; H02M 3/158; H02M 3/156
See application file for complete search history.

(56) References Cited

U.S. PATENT DOCUMENTS 5,063,343 A * 11/1991 Fitzpatrick ......... H03K 17/6871
323/317
10,756,729 B2    8/2020 Lee
(Continued)

*Primary Examiner* — Nguyen Tran
(74) *Attorney, Agent, or Firm* — Standley Law Group LLP; Jeffrey S. Standley; Adam J. Smith

(57) ABSTRACT

A power on/off control circuit and an electronic device is provided, the circuit including: a switching element, a first semiconductor switching circuit including a first semiconductor switching element, a second semiconductor switching circuit including a second semiconductor switching element, and a holding circuit connected between a first terminal of the first semiconductor switching element and a second terminal of the second semiconductor switching element. When the switching element is closed, the first semiconductor switching element is turned on. When the first semiconductor switching element is turned on, the second semiconductor switching element is turned on, and a power on signal is output via the second terminal of the second semiconductor switching element. When the second semiconductor switching element is turned on, the holding circuit is operable to maintain the on state of the first semiconductor switching element. The control circuit can stably lock a started state.

11 Claims, 4 Drawing Sheets

(56) References Cited

U.S. PATENT DOCUMENTS 11,061,425 B2     7/2021   Liu
2013/0038355 A1*   2/2013   Heo ..................... H03K 17/164
                                                                                                                                                     327/109

* cited by examiner

POWER ON/OFF CONTROL CIRCUIT AND ELECTRONIC DEVICE

FIELD OF THE INVENTION

The present invention relates to the field of electronic circuits, and in particular, to a power on/off control circuit and an electronic device comprising a power on/off control circuit.

BACKGROUND AND SUMMARY OF THE INVENTION

Many instruments and electronic devices have to be powered on through push-button control after they are connected to a power supply. If the push-button switch is a non-mechanical switch, it is required to ensure that the power on state of the electronic device is locked after the push-button is pressed. However, as the software system becomes more and more complex, the control system of the electronic device is often unable to send out an effective lock signal in a very short time. Currently, two solutions are proposed to solve this problem. First, by adding another control system. The control system may be a microprocessor or a programmable processor. However, adding a microprocessor or adding a programmable processor requires additional space and coding, thereby causing additional costs. Second, by using a dedicated power on/off control chip. However, using a dedicated control chip is not widely adopted because this solution is not cheap, thereby increases the overall cost of the electronic device.

A technical problem to be solved by this invention is to provide a power on/off control circuit featuring simple design and low cost and an electronic device including the power on/off control circuit.

In order to solve the above technical problem, the present invention provides a power on/off control circuit, including: a switching element, a first semiconductor switching circuit, a second semiconductor switching circuit, and a holding circuit, where the first semiconductor switching circuit includes a first semiconductor switching element having three terminals, the switching element is connected to a first terminal of the first semiconductor switching element, and a second terminal of the first semiconductor switching element is connected to the second semiconductor switching circuit, where when the switching element is closed, the first semiconductor switching element is turned on; the second semiconductor switching circuit includes a second semiconductor switching element having three terminals, and the second terminal of the first semiconductor switching element is connected to a first terminal of the second semiconductor switching element, where when the first semiconductor switching element is turned on, the second semiconductor switching element is turned on, and a power on signal is output via a second terminal of the second semiconductor switching element; and the holding circuit is connected between the first terminal of the first semiconductor switching element and the second terminal of the second semiconductor switching element, and when the second semiconductor switching element is turned on, the holding circuit is operable to maintain the on state of the first semiconductor switching element.

In an embodiment of the present invention, the first semiconductor switching circuit further includes: a first diode and a first resistor, where the switching element is connected to a positive terminal of the first diode, a negative terminal of the first diode is connected to a first terminal of the first resistor, and a second terminal of the first resistor is connected to the first terminal of the first semiconductor switching element.

In an embodiment of the present invention, the first semiconductor switching circuit further includes: a third resistor and a fourth resistor, where a first terminal of the third resistor is connected to the first terminal of the first resistor, and a second terminal of the third resistor is grounded; and a first terminal of the fourth resistor is connected to the first terminal of the third resistor, and a second terminal of the fourth resistor is connected to the holding circuit.

In an embodiment of the present invention, the second semiconductor switching circuit further includes: a fifth resistor and a sixth resistor, where a first terminal of the fifth resistor is connected to the first terminal of the second semiconductor switching element, and a second terminal of the fifth resistor is connected to the second terminal of the first semiconductor switching element. A first terminal of the sixth resistor is connected to the second terminal of the fifth resistor, and a second terminal of the sixth resistor is connected to a third terminal of the second semiconductor switching element.

In an embodiment of the present invention, the holding circuit includes: a second diode and a seventh resistor, where a positive terminal of the second diode is connected to a first terminal of the seventh resistor, and a negative terminal of the second diode is connected to the second terminal of the fourth resistor; and a second terminal of the seventh resistor is connected to the second terminal of the second semiconductor switching element.

In an embodiment of the present invention, the power on/off control circuit further includes a power off detection circuit, where the switching element is connected to the power off detection circuit, and when a duration for which the switching element is closed is greater than or equal to a preset duration, the power off detection circuit outputs a power off indication signal.

In an embodiment of the present invention, the power off detection circuit includes a third semiconductor switching element having three terminals, where the switching element is connected to a first terminal of the third semiconductor switching element, and when the duration for which the switching element is closed is greater than or equal to the preset duration, the third semiconductor switching element maintains an on state until the switching element is open, and the power off indication signal is output via a second terminal of the third semiconductor switching element.

In an embodiment of the present invention, the power off detection circuit further includes an eighth resistor and a ninth resistor, where the switching element is connected to a first terminal of the eighth resistor, a second terminal of the eighth resistor is connected to the first terminal of the third semiconductor switching element, the second terminal of the third semiconductor switching element is connected to a first terminal of the ninth resistor, and the power off indication signal is output via a second terminal of the ninth resistor.

In an embodiment of the present invention, the power on/off control circuit further includes a power-down control circuit including a fourth semiconductor switching element having three terminals, where a second terminal of the fourth semiconductor switching element is connected to the first terminal of the seventh resistor, and when the fourth semiconductor switching element is turned on, the second semiconductor switching element is turned off, and a power-down signal is output via the second terminal of the second semiconductor switching element.

In an embodiment of the present invention, the power-down control circuit further includes a tenth resistor, where a first terminal of the tenth resistor is connected to the first terminal of the fourth semiconductor switching element, and when the power off detection circuit stops outputting the power off indication signal, a power-down indication signal is received via a second terminal of the tenth resistor and causes the fourth semiconductor switching element to be turned on.

In order to solve the above technical problem, the present invention further proposes an electronic device including the power on/off control circuit as described above.

The power on/off control circuit of the present invention can stably lock a power on state via the holding circuit; and can close the first semiconductor switching element in advance by providing a resistor voltage divider in the first semiconductor switching circuit, thereby ensuring stable power off state of the electronic device. The power on/off control circuit and the electronic device of the present invention also have advantages of simple design and low cost.

BRIEF DESCRIPTION OF THE DRAWINGS

The accompanying drawings are included to provide a further understanding of the present application and are incorporated in and constitute a part of the present application, show the embodiments of the present application, and serve to, together with this specification, explain the principles of the present invention. In the accompanying drawings.

DETAILED DESCRIPTION OF EMBODIMENTS

Figure 1:
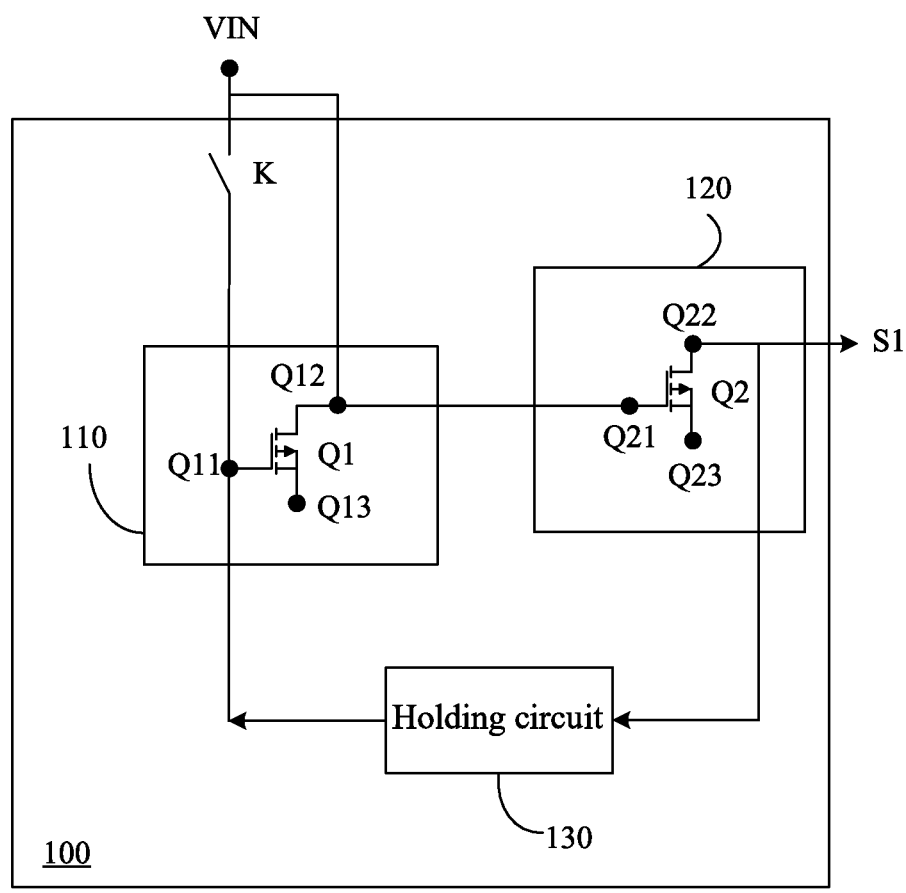
FIG. 1 is a schematic diagram of a circuit structure of a power on/off control circuit according to an embodiment of the present invention.

To describe the technical solutions in embodiments of the present application more clearly, the accompanying drawings required for describing the embodiments will be briefly described below. Apparently, the accompanying drawings in the following description show merely some examples or embodiments of the present application, and those of ordinary skill in the art would apply the present application to other similar scenarios according to these drawings without any creative effort. Unless it is obvious from the context or otherwise stated, the same reference numerals in the accompanying drawings represent the same structure or operation.

As shown in the present application and the claims, unless the context expressly indicates otherwise, the words "a", "an", "said", and/or "the" do not specifically refer to the singular, but may also include the plural. Generally, the terms "include" and "comprise" only suggest that the expressly identified steps and elements are included, but these steps and elements do not constitute an exclusive list, and the method or device may further include other steps or elements.

Unless specifically stated otherwise, the relative arrangement of components and steps, numerical expressions and numerical values set forth in these embodiments do not limit the scope of the present application. In addition, it should be understood that, for ease of description, the sizes of various parts shown in the drawings are not drawn to scale. The technologies, methods, and devices known to those of ordinary skill in the related art may not be discussed in detail, but where appropriate, the technologies, methods, and devices should be regarded as part of the authorization specification. In all examples shown and discussed here, any specific value should be interpreted as merely exemplary and not as limiting. Therefore, other examples of the exemplary embodiment may have different values. It should be noted that similar reference signs and letters refer to similar items in the following drawings. Therefore, once a specific item is defined in one of the drawings, it need not be further discussed in subsequent drawings.

For convenience of description, spatially relative terms such as "on", "above", "on the top surface", and "upper" can be used herein to describe a spatial position relationship between a device or a feature shown in the figure and other devices or features. It should be understood that spatially relative terms are intended to include different orientations in use or operation in addition to the orientation of the device described in the figure. For example, if the device in the figure is inverted, the device described as "on other devices or structures" or "above other devices or structures" will then be positioned as "under other devices or structures" or "below other devices or structures". Therefore, the exemplary term "above" may include two orientations "above" and "below". The device may also be positioned in other different manners (rotated by 90 degrees or in other orientations), and spatially relative description used here is explained accordingly.

In addition, it should be noted that the use of words such as "first" and "second" to define parts is merely for the convenience of distinguishing between corresponding parts. Unless otherwise stated, the above words have no special meaning and therefore cannot be understood as a limitation on the protection scope of the present application. Furthermore, although the terms used in the present application are selected from well-known common terms, some of the terms mentioned in the specification of the present application may have been selected by the applicant according to his or her determination, and the detailed meaning thereof is described in the relevant section described herein. Furthermore, the present application must be understood, not simply by the actual terms used but also by the meanings encompassed by each term.

FIG. 1 is a schematic diagram of a circuit structure of a power on/off control circuit according to an embodiment of the present invention. Referring to FIG. 1, the power on/off control circuit 100 in this embodiment includes a switching element K, a first semiconductor switching circuit 110, a second semiconductor switching circuit 120, and a holding circuit 130. The first semiconductor switching circuit 110 includes a first semiconductor switching element Q1 having three terminals Q11, Q12, and Q13, the switching element K is connected to the first terminal Q11 of the first semiconductor switching element Q1, and the second terminal Q12 of the first semiconductor switching element Q1 is connected to the second semiconductor switching circuit 120, where when the switching element K is closed, the first semiconductor switching element Q1 is turned on; the second semiconductor switching circuit 120 includes a second semiconductor switching element Q2 having three terminals Q21, Q22, and Q23, and the second terminal Q12 of the first semiconductor switching element Q1 is connected to the first terminal Q21 of the second semiconductor switching element Q2, where when the first semiconductor switching element Q1 is turned on, the second semiconductor switching element Q2 is turned on, and a power on signal S1 is output via the second terminal Q22 of the second semiconductor switching element Q2; and the holding circuit 130 is connected between the first terminal Q11 of the first semiconductor switching element Q1 and the second terminal Q22 of the second semiconductor switching element Q2, and when the second semiconductor switching element Q2 is turned on, the holding circuit 130 is operable to maintain the on state of the first semiconductor switching element Q1.

In some embodiments, the switching element K shown in FIG. 1 is a push-button switch. According to the embodiment shown in FIG. 1, when the switching element K is closed, that is, when the push-button switch is pressed down, both the first semiconductor switching element Q1 and the second semiconductor switching element Q2 in the first semiconductor switching circuit 110 are turned on, and the holding circuit 130 maintains the on state of the first semiconductor switching element Q1 and thus the on state of the second semiconductor switching element Q2, thereby locking the started state.

Referring to FIG. 1, one terminal of the switching element K is connected to an input voltage VIN, and the other terminal of the switching element K is connected to the first terminal Q11 of the first semiconductor switching element Q1. The second terminal Q12 of the first semiconductor switching element Q1 is connected to the input voltage VIN, and the first terminal Q21 of the second semiconductor switching element Q2 is also connected to the input voltage VIN.

In some embodiments, the input voltage VIN may be a system power supply voltage.

In some embodiments, both the first semiconductor switching element Q1 and the second semiconductor switching element Q2 are MOSFET elements, where the first terminals Q11 and Q21 are control gates, the second terminals Q12 and Q22 are drains, and the third terminals Q13 and Q23 are sources. Since the MOSFET elements are turned on very fast, usually in nanoseconds, the started state can be stably and effectively locked while the switching element K is closed.

Referring to FIG. 1, the power on signal S1 output via the second terminal Q22 of the second semiconductor switching element Q2 may be connected to another circuit, and the power on signal S1 is used to control the electronic device to be powered up. In some embodiments, the power on signal S1 is connected to a processor, and the processor is operable to control the electronic device to be powered up according to the power on signal S1.

In some embodiments, the power on signal S1 is connected to an enable terminal of a voltage driving circuit to indicate the voltage driving circuit to operate, and the voltage driving circuit outputs a control signal to control the electronic device to be powered up. In some embodiments, the voltage driving circuit is connected to the processor and outputs an operating voltage required for the processor, and the processor controls power on of the electronic device according to the operating voltage. In particular, this will be described later in conjunction with FIG. 4.

It can be understood that an output signal is output via the second terminal Q22 of the second semiconductor switching element Q2. When the output signal is used to indicate the electronic device to be powered up, the output signal is referred to as the power on signal S1. When the output signal is not used to indicate the electronic device to be powered up, the output signal is not referred to as the power on signal S1. In some embodiments, when the output signal of the second terminal Q22 being 1 is used to indicate the electronic device to be powered up, the output signal is referred to as the power on signal S1; and when the output signal of the second terminal Q22 being 0 is used to indicate the electronic device to be powered off, the output signal is referred to as a power off signal and may be used to control the electronic device to be powered off.

Figure 2:
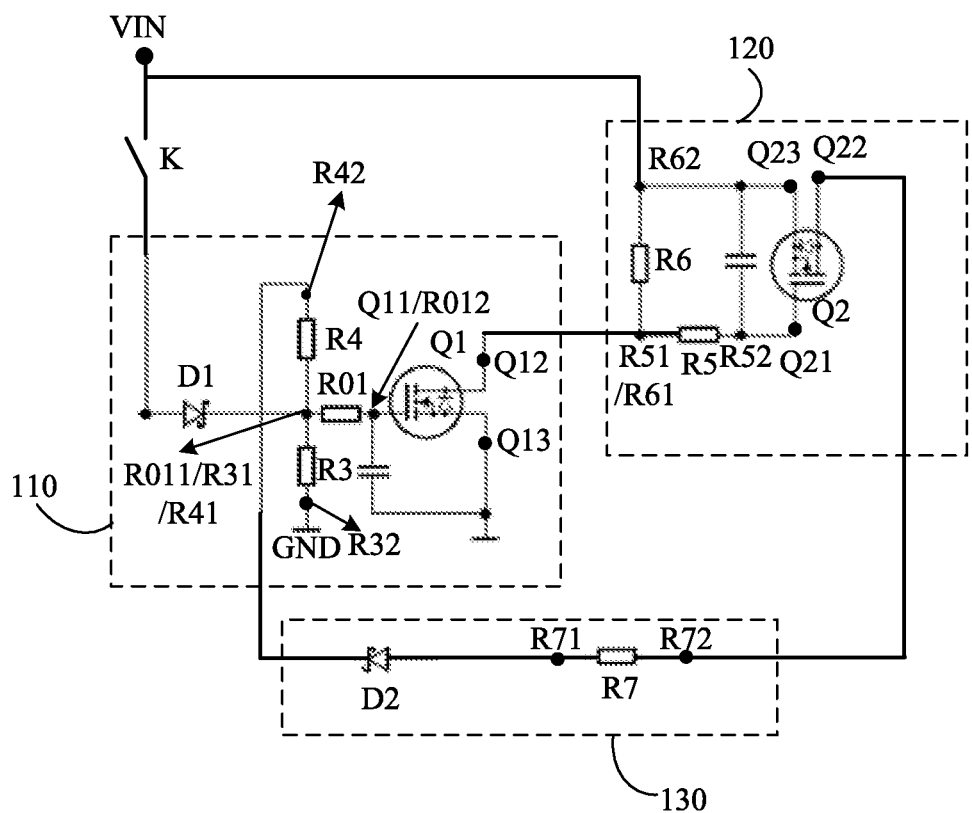
FIG. 2 is a schematic diagram of a structure of a power on/off control circuit according to another embodiment of the present invention.

FIG. 2 is a schematic diagram of a structure of a power on/off control circuit according to another embodiment of the present invention. The embodiment shown in FIG. 2 is a variation based on the embodiment shown in FIG. 1, and the same elements in FIG. 2 are thus denoted by the same reference numerals as in FIG. 1. Referring to FIG. 2, in this embodiment, the first semiconductor switching circuit 110 further includes: a first diode D1 and a first resistor R01. The switching element K is connected to a positive terminal of the first diode D1, a negative terminal of the first diode D1 is connected to a first terminal R011 of the first resistor R01, and a second terminal R012 of the first resistor R01 is connected to the first terminal Q11 of the first semiconductor switching element Q1. As shown in FIG. 2, the first resistor R01 is connected between the first diode D1 and the first terminal Q11 of the first semiconductor switching element Q1. As shown in FIG. 2, the upper of the switching element K is connected to the input voltage VIN. When the switching element K is closed, the input voltage VIN may turn on the first semiconductor switching element Q1 via the first diode D1 and the first resistor R01.

Referring to FIG. 2, in some embodiments, the first semiconductor switching circuit 110 further includes: a third resistor R3 and a fourth resistor R4. A first terminal R31 of the third resistor R3 is connected to the first terminal R011 of the first resistor R01, and a second terminal R32 of the third resistor R3 is grounded (GND). A first terminal R41 of the fourth resistor R4 is connected to the first terminal R31 of the third resistor R3, and a second terminal R42 of the fourth resistor R4 is connected to the holding circuit 130.

When the electronic device is in power on state, if the electronic device is powered off by directly removing a power supply of the electronic device rather than by controlling the electronic device to be powered off with the push-button switch, the second semiconductor switching element Q2 is still turned on due to energy storage of a capacitive element in the circuit. As a result, if the electronic device is connected to the power supply again in a short time, the system may be automatically powered up before a user presses down a power on button. In the foregoing embodiment, the third resistor R3 and the fourth resistor R4 are provided in the first semiconductor switching circuit 110 and can divide a voltage, such that the first semiconductor switching element Q1 can be turned off in advance, and the second semiconductor switching element Q2 can also be turned off. When the second semiconductor switching element Q2 is turned off, the power on signal S1 of the second terminal Q22 of the second semiconductor switching element Q2 is invalid. For example, the output signal of the second terminal Q22 is 0, which indicates the electronic device to be powered off, thereby achieving stable power off of the system of the electronic device.

Referring to FIG. 2, in some embodiments, the second semiconductor switching circuit 120 further includes: a fifth resistor R5 and a sixth resistor R6. A second terminal R52 of the fifth resistor R5 is connected to the first terminal Q21 of the second semiconductor switching element Q2, and a first terminal R51 of the fifth resistor R5 is connected to the second terminal Q12 of the first semiconductor switching element Q1. A first terminal R61 of the sixth resistor R6 is connected to the first terminal R51 of the fifth resistor R5, and a second terminal R62 of the sixth resistor R6 is connected to a third terminal Q23 of the second semiconductor switching element Q2. As shown in FIG. 2, according to these embodiments, when the switching element K is closed, the input voltage VIN may turn on the first semiconductor switching element Q1 via the first diode D1 and the first resistor R01, and further turn on the second semiconductor switching element Q2 via the fifth resistor R5 and the sixth resistor R6.

Referring to FIG. 2, the second terminal R62 of the sixth resistor R6 is connected to the input voltage VIN.

Referring to FIG. 2, in some embodiments, the holding circuit 130 includes: a second diode D2 and a seventh resistor R7. A positive terminal of the second diode D2 is connected to a first terminal R71 of the seventh resistor R7, and a negative terminal of the second diode D2 is connected to the second terminal R42 of the fourth resistor R4. A second terminal R72 of the seventh resistor R7 is connected to the second terminal Q22 of the second semiconductor switching element Q2. When the second semiconductor switching element Q2 is turned on, a voltage maintains the on state of the first semiconductor switching element Q1 and thus the on state of the second semiconductor switching element Q2 via the seventh resistor R7 and the second diode D2, thereby achieving a function of locking the started state.

Figure 3:
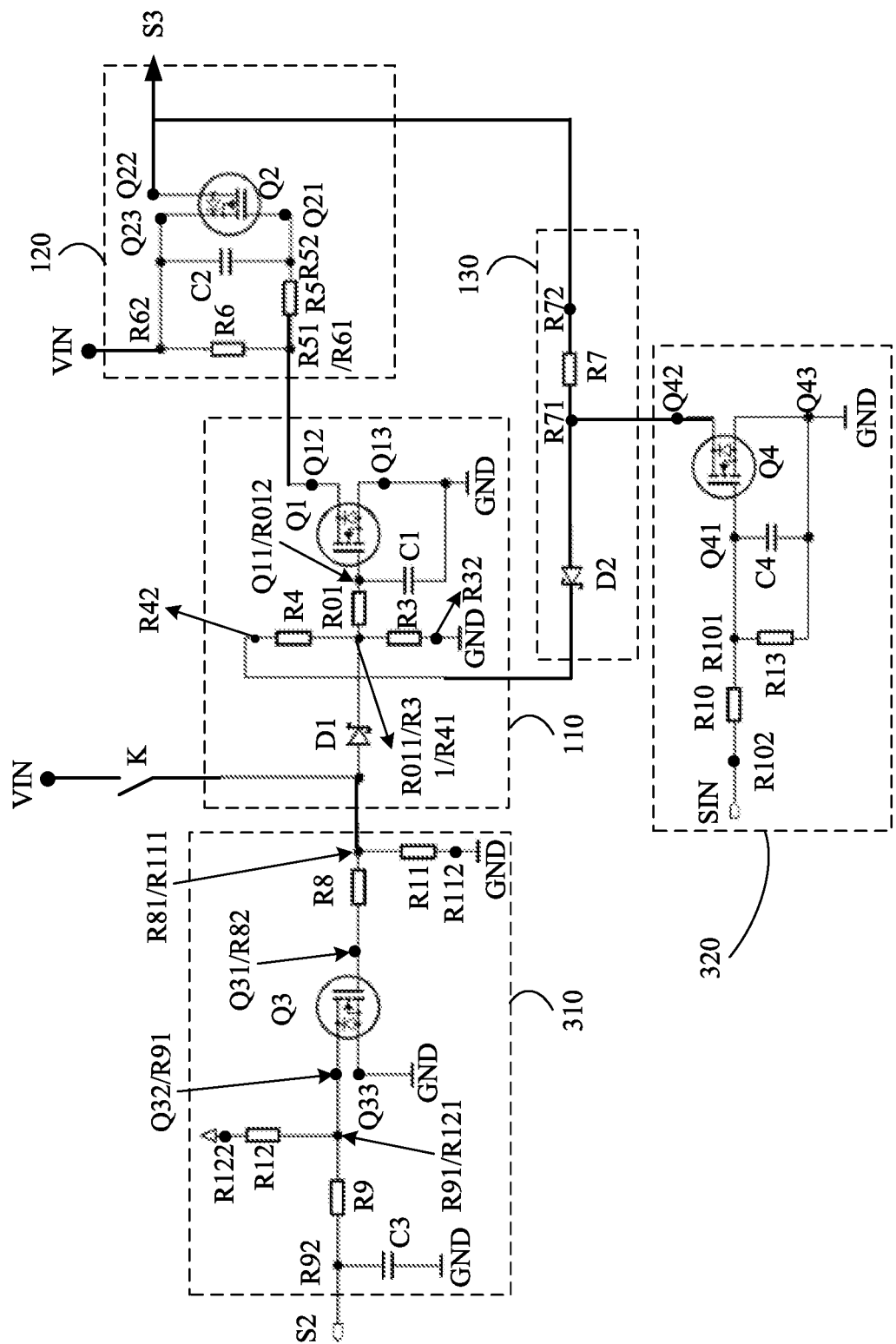
FIG. 3 is a schematic diagram of a structure of a power on/off control circuit according to another embodiment of the present invention.

FIG. 3 is a schematic diagram of a structure of a power on/off control circuit according to another embodiment of the present invention. The embodiment shown in FIG. 3 is a variation based on the embodiment shown in FIG. 2, and the same elements in FIG. 3 are thus denoted by the same reference numerals as in FIG. 2. Referring to FIG. 3, the power on/off control circuit of this embodiment, on the basis of the second embodiment, further includes a power off detection circuit 310. The switching element K is connected to the power off detection circuit 310. When a duration for which the switching element K is closed is greater than or equal to a preset duration T, the power off detection circuit 310 outputs a power off indication signal S2.

The present invention imposes no limitation on a specific implementation of the power off detection circuit 310.

FIG. 3 shows a specific embodiment. In this embodiment, the power off detection circuit 310 includes a third semiconductor switching element Q3 having three terminals Q31, Q32, and Q33. The switching element K is connected to the first terminal Q31 of the third semiconductor switching element Q3. When the duration for which the switching element K is closed is greater than or equal to the preset duration T, the third semiconductor switching element Q3 maintains an on state until the switching element K is open, and the power off indication signal S2 is output via a second terminal Q32 of the third semiconductor switching element Q3. Referring to FIG. 3, the third terminal Q33 of the third semiconductor switching element Q3 is grounded (GND). When the switching element K is a push-button switch, and the user long presses the switching element K, a duration of the long press is the duration for which the switching element K is closed. A preset duration T is set as required. When the duration for which the switching element K is long pressed is greater than or equal to the preset duration T, it indicates that the long press operation is a power off operation. In this case, the power off detection circuit 310 outputs the power off indication signal S2 via the second terminal Q32 of the third semiconductor switching element Q3, and the power off indication signal S2 may be output to the corresponding processor, which controls the electronic device to be powered off.

Referring to FIG. 3, in some embodiments, the power off detection circuit 310 further includes an eighth resistor R8 and a ninth resistor R9. The switching element K is connected to a first terminal R81 of the eighth resistor R8, a second terminal R82 of the eighth resistor R8 is connected to the first terminal Q31 of the third semiconductor switching element Q3, the second terminal Q32 of the third semiconductor switching element Q3 is connected to a first terminal R91 of the ninth resistor R9, and the power off indication signal S2 is output via the second terminal R92 of the ninth resistor R9. In this embodiment, when the switching element K is long pressed, the input voltage VIN turns on the third semiconductor switching element Q3 for a long time via the eighth resistor R8, and lowers the power off indication signal S2 via the ninth resistor R9. In this embodiment, the power off indication signal S2 being a low level is used to indicate power off. In an embodiment in which the power off indication signal S2 is output to the processor, when the processor detects that a time for which the power off indication signal S2 is at the low level reaches the preset duration T, the processor may control the electronic device to be powered off.

Referring to FIG. 3, in some embodiments, the power off detection circuit 310 further includes an eleventh resistor R11 and a twelfth resistor R12. A first terminal R111 of the eleventh resistor R11 is connected to the first terminal R81 of the eighth resistor R8, and a second terminal R112 of the eleventh resistor R11 is grounded (GND). A first terminal R121 of the twelfth resistor R12 is connected to the first terminal R91 of the ninth resistor R9, and a second terminal R122 of the twelfth resistor R12 is connected to a system high level. The second terminal R112 of the eleventh resistor R11 is grounded (GND), such that a gate control voltage of the third semiconductor switching element Q3 can be lowered, and the third semiconductor switching element Q3 is in an off state by default. The second terminal R122 of the twelfth resistor R12 may be connected to the voltage input VIN and may be at a high level by default, such that the twelfth resistor R12 can pull the power off indication signal S2 high by default, that is, the electronic device is not powered off by default.

In the foregoing embodiment, when the power off indication signal S2 output via the second terminal R92 of the ninth resistor R9 is at a low level, it serves as a signal to indicate the electronic device to be powered off. In other embodiments, no limitation is imposed on whether the power off indication signal S2 is at a high level or a low level. When the power off indication signal S2 is at a high level, the position and the connection relationship of the related elements may be adjusted accordingly such that the power off indication signal S2 is at a low level by default.

Referring to FIG. 3, in some embodiments, the power on/off control circuit of the present invention further includes a power-down control circuit 320 including a fourth semiconductor switching element Q4 having three terminals Q41, Q42, and Q43. The second terminal Q42 of the fourth semiconductor switching element Q4 is connected to the first terminal R71 of the seventh resistor R7. When the fourth semiconductor switching element Q4 is turned on, the second semiconductor switching element Q2 is turned off, and a power-down signal S3 is output via the second terminal Q22 of the second semiconductor switching element Q2. The power-down control circuit 320 controls the second semiconductor switching element Q2 via the fourth semiconductor switching element Q4. When the second semiconductor switching element Q2 is turned off, the power-down signal S3 is output via the second terminal Q22 of the second semiconductor switching element Q2. The power-down signal S3 output via the second terminal Q22 may be used to control the electronic device to be powered down. In some embodiments, the power-down signal S3 is output to the processor, which controls the electronic device to be powered down.

Referring to FIG. 3, in some embodiments, the power-down control circuit 320 further includes a tenth resistor R10. A first terminal R101 of the tenth resistor R10 is connected to the first terminal Q41 of the fourth semiconductor switching element Q4. When the power off detection circuit 310 stops outputting the power off indication signal S2, a power-down indication signal SIN is received via a second terminal R102 of the tenth resistor R10 and causes the fourth semiconductor switching element Q4 to be turned on. When the fourth semiconductor switching element Q4 is turned on, the second semiconductor switching element Q2 can be turned off, such that the power-down signal S3 is output via the second terminal Q22 of the second semiconductor switching element Q2 to control the electronic device to be powered down. In this embodiment, the power-down indication signal SIN may be sent by the processor to the power-down control circuit 320.

Referring to FIG. 3, the power-down control circuit 320 may further include a thirteenth resistor R13. One terminal of the thirteenth resistor R13 is connected to the first terminal R101 of the tenth resistor R10, and the other terminal of the thirteenth resistor R13 is grounded. In a default state, because the other terminal of the thirteenth resistor R13 is grounded, the fourth semiconductor switching element Q4 maintains the off state. When the power-down indication signal SIN, which is at a high level, is received via the second terminal R102 of the tenth resistor R10, the voltage of the first terminal Q41 of the fourth semiconductor switching element Q4 is pulled high, such that the fourth semiconductor switching element Q4 is turned on. Further, the first semiconductor switching element Q1 is turned off via the second diode D2 and the first resistor R01, and further the second semiconductor switching element Q2 is turned off, such that the power-down signal S3 is output via the second terminal Q22 of the second semiconductor switching element Q2 to control the electronic device to be powered down.

In the foregoing embodiment, when the duration for which the switching element K is closed is greater than or equal to the preset duration T, the power off detection circuit outputs the power off indication signal S2. For example, the power off indication signal S2 being at a low level is used to indicate power off. In this case, the processor may control the electronic device to perform pre-power off, for example, to turn off a screen or the like visible to the human eyes. For the push-button switch, when the user long presses the push-button for the preset duration T and then releases the push-button, the power off detection circuit 310 stops outputting the power off indication signal S2. For example, the power off indication signal S2 is restored to the high level, and when the processor detects that the power off indication signal S2 is restored to the high level, the power off preparation such as storage of data is started. Then, the processor sends the power-down indication signal SIN to the second terminal R102 of the tenth resistor R10 to turn on the fourth semiconductor switching element Q4 and finally turn off the second semiconductor switching element Q2, thereby controlling the electronic device to be powered down and powered off.

In some embodiments, both the third semiconductor switching element Q3 and the fourth semiconductor switching element Q4 are MOSFET elements, where the first terminals Q31 and Q41 are control gates, the second terminals Q32 and Q42 are drains, and the third terminals Q33 and Q33 are sources.

Referring to FIG. 3, in this embodiment of the present invention, the first semiconductor switching circuit 110 further includes a first capacitor C1 connected between the first terminal Q11 of the first semiconductor switching element Q1 and the ground GND; the second semiconductor switching circuit 120 further includes a second capacitor C2 connected between the first terminal Q21 of the second semiconductor switching element Q2 and the input voltage VIN; the power off detection circuit 310 further includes a third capacitor C3 connected between the second terminal R92 of the ninth resistor R9 and the ground GND; and the power-down control circuit 320 further includes a fourth capacitor C4 connected between the first terminal Q41 of the fourth semiconductor switching element Q4 and the ground GND. C1, C2, C3, and C4 are all for noise filtering in the respective circuits to prevent transient changes in the signal.

Figure 4:
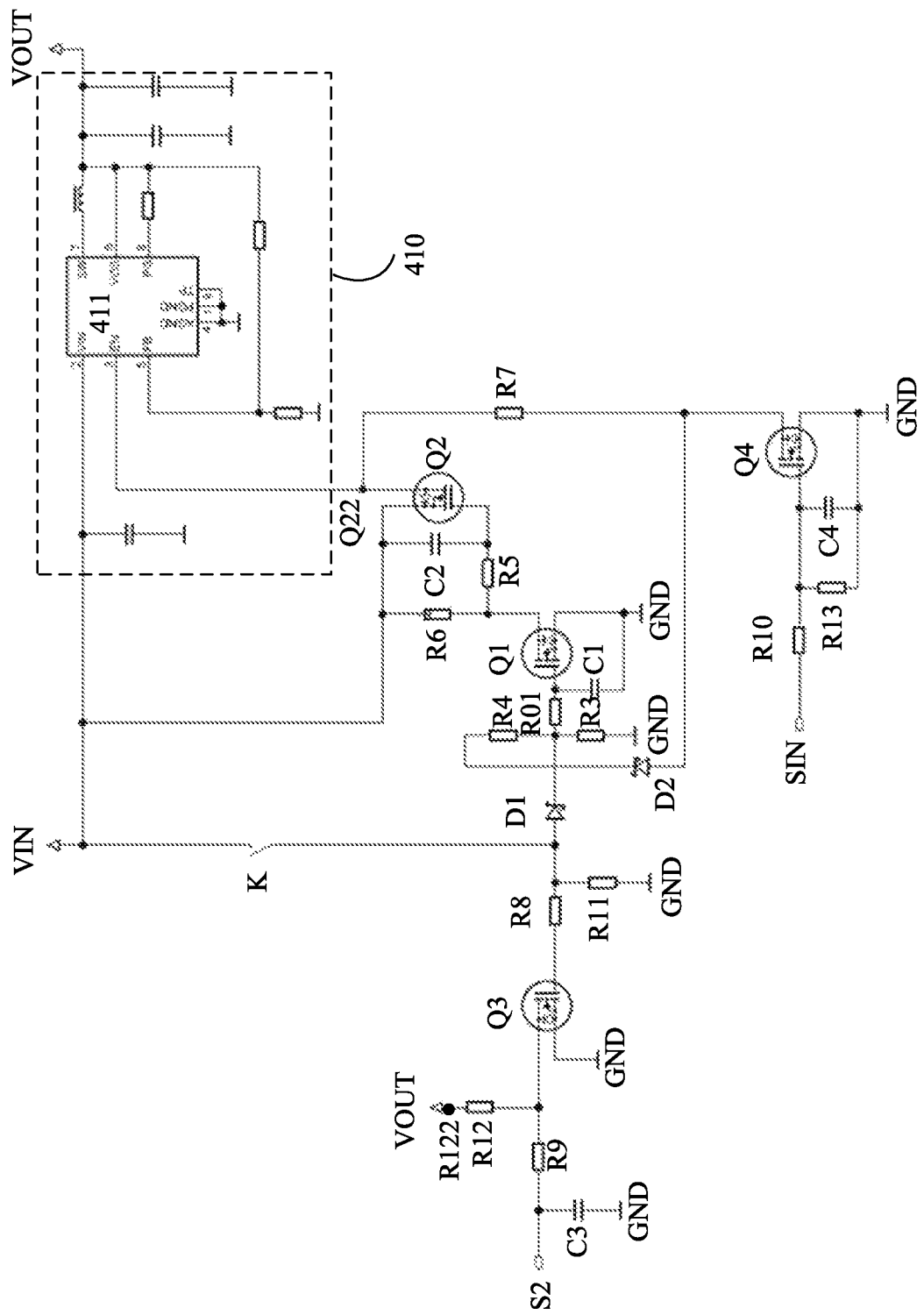
FIG. 4 is a schematic diagram of a structure of a power on/off control circuit according to another embodiment of the present invention.

FIG. 4 is a schematic diagram of a structure of a power on/off control circuit according to another embodiment of the present invention. The embodiment shown in FIG. 4 is a variation based on the embodiment shown in FIG. 3, and the same elements in FIG. 4 are thus denoted by the same reference numerals as in FIG. 3. Referring to FIG. 4, this embodiment differs from the embodiment shown in FIG. 3 in that the second terminal Q22 of the second semiconductor switching element Q2 is also connected to the voltage driving circuit 410. Specifically, the voltage driving circuit 410 is a voltage driver and mainly includes a DC/DC converter 411. The second terminal Q22 of the second semiconductor switching element Q2 is connected to an enable terminal EN of the DC/DC converter 411, and the output signal of the second terminal Q22 of the second semiconductor switching element Q2 serves as an enable signal of the DC/DC converter 411. The input voltage VIN is simultaneously input to the voltage input terminal of the DC/DC converter 411. When the power on signal S1 is output via the second terminal Q22 of the second semiconductor switching element Q2, the DC/DC converter 411 outputs a voltage VOUT to the processor, which controls the electronic device to be powered down.

In the embodiment shown in FIG. 4, the output voltage VOUT is also connected to the second terminal R122 of the twelfth resistor R12. When the electronic device is in a started state, the output voltage VOUT is at a high level, and at the same time, the power off indication signal S2 is pulled high to a high level via the twelfth resistor R12 by default, that is, the electronic device is not powered off by default.

Referring to FIG. 4, when the switching element K is closed, the on state of the second semiconductor switching element Q2 can be maintained by the holding circuit 130, and the power on signal S1 is continuously output via the second terminal Q22 of the second semiconductor switching element Q2 to the enable terminal EN of the DC/DC converter 411, such that the output voltage VOUT of the DC/DC converter 411 is maintained at the high level, and the started state can be stably locked.

When the power supply is directly removed from the electronic device in the started state, the second semiconductor switching element Q2 is still turned on due to the energy storage of the capacitive element, and the discharge of the enable terminal EN of the DC/DC converter 411 is very slow. According to the present invention, the third resistor R3 and the fourth resistor R4 are provided in the first semiconductor switching circuit 110 and can divide a voltage, such that the first semiconductor switching element Q1 can be turned off in advance, and the second semiconductor switching element Q2 can also be turned off, which causes an electric potential of the enable terminal EN to be rapidly lowered, thereby stably shutting down the electronic device.

When the switching element K is long pressed and the duration for which the switching element K is closed is greater than or equal to the preset duration T, the power off detection circuit 310 outputs the power off indication signal S2. When the processor sends the power-down indication signal SIN to the second terminal R102 of the tenth resistor R10, the fourth semiconductor switching element Q4 is turned on, and finally the second semiconductor switching element Q2 is turned off, such that the electric potential of the enable terminal EN becomes low, and the electronic device is powered down and powered off.

Referring to FIG. 4, the voltage driving circuit 410 further includes some resistive elements, capacitive elements, and the like, which are not limited in the present invention and may be provided as required.

The voltage driving circuit 410 of the present invention is not limited to the DC/DC converter 411 shown in FIG. 4. In other embodiments, another type of functional element, such as an LDO or a MOSFET, may be employed as the voltage conversion element.

The power on/off control circuit of the present invention features simple design and low cost, and can stably lock the started state, and can ensure stable power off of the electronic device.

The present invention further includes an electronic device including the power on/off control circuit of the present invention. The electronic device can be stably locked in a started state and stably powered off.

The basic concepts have been described above. Obviously, for those skilled in the art, the foregoing disclosure of the invention is merely an example and does not constitute a limitation to the present application. Those skilled in the art may make various modifications, improvements, and amendments to the present application, although it is not explicitly stated here. Such modifications, improvements, and amendments are suggested in the present application, and therefore, such modifications, improvements, and amendments still fall within the spirit and scope of exemplary embodiments of the present application.

Also, the present application uses specific words to describe embodiments of the present application. For example, "one embodiment", "an embodiment", and/or "some embodiments" mean a certain feature, structure, or characteristic related to at least one embodiment of the present application. Therefore, it should be emphasized and noted that "an embodiment" or "one embodiment" or "an alternative embodiment" mentioned twice or more in different positions in this specification does not necessarily refer to the same embodiment. In addition, certain features, structures, or characteristics in one or more embodiments of the present application can be appropriately combined.

Similarly, it should be noted that, in order to simplify the expressions disclosed in the present application to facilitate the understanding of one or more embodiments of the present invention, in the foregoing description of the embodiments of the present application, various features may be sometimes incorporated into one embodiment, figure or the description thereof. However, such a method disclosed does not mean that the subject of the present application requires more features than those mentioned in the claims. In fact, the features of the embodiments are fewer than all the features of a single embodiment disclosed above.

In some embodiments, numbers for describing the number of compositions and attributes are used. It should be understood that such numbers used in the description of the embodiments are modified by the modifier "about", "approximately", or "substantially" in some examples. Unless otherwise stated, "about", "approximately", or "substantially" indicates that the number is allowed to vary by ±20%. Correspondingly, in some embodiments, the numerical parameters used in the specification and claims are approximate values, and the approximate values can be changed according to the required characteristics of individual embodiments. In some embodiments, for the numerical parameters, the specified significant digits should be taken into consideration and a general digit reservation method should be used. Although the numerical ranges and parameters used to confirm the breadth of the ranges of the numerical parameters in some embodiments of the present application are approximate values, such numerical values need to be set as precisely as possible within a feasible range in specific embodiments.

REFERENCE SIGNS LIST

100 power on/off control circuit
110 first semiconductor switching circuit
120 second semiconductor switching circuit
130 holding circuit
K switching element
Q1, Q2, . . . Qn semiconductor switching elements
Q11, Q12, . . . Qmm terminals of semiconductor switching elements
S1 power on signal
S2 power off indication signal
S3 power-down signal
VIN input voltage
SIN power-down indication signal
C1, C2, . . . Cn capacitors
D1 first diode
D2 second diode
Rn resistors
Rmm terminals of resistors
310 power off detection circuit
320 power-down control circuit
410 voltage driving circuit
411 DC/DC converter
EN enable terminal
VOUT output voltage

What is claimed is:

1. A power on/off control circuit, comprising:
a switching element;
a first semiconductor switching circuit comprising a first semiconductor switching element having three terminals;
a second semiconductor switching circuit comprising a second semiconductor switching element having three terminals; and
a holding circuit;
wherein the switching element is connected to a first terminal of the first semiconductor switching element, and a second terminal of the first semiconductor switching element is connected to the second semiconductor switching circuit, and when the switching element is closed, the first semiconductor switching element is turned on;

wherein the second terminal of the first semiconductor switching element is connected to a first terminal of the second semiconductor switching element, and when the first semiconductor switching element is turned on, the second semiconductor switching element is turned on, and a power on signal is output via a second terminal of the second semiconductor switching element; and wherein the holding circuit is connected between the first terminal of the first semiconductor switching element and the second terminal of the second semiconductor switching element, and when the second semiconductor switching element is turned on, the holding circuit is operable to maintain on state of the first semiconductor switching element:

wherein the first semiconductor switching circuit further comprises: a first diode and a first resistor, wherein the switching element is connected to a positive terminal of the first diode, a negative terminal of the first diode is connected to a first terminal of the first resistor, and a second terminal of the first resistor is connected to the first terminal of the first semiconductor switching element.

2. The power on/off control circuit of claim 1, wherein:
the first semiconductor switching circuit further comprises a third resistor and a fourth resistor;
a first terminal of the third resistor is connected to the first terminal of the first resistor, and a second terminal of the third resistor is grounded; and
a first terminal of the fourth resistor is connected to the first terminal of the third resistor, and a second terminal of the fourth resistor is connected to the holding circuit.

3. The power on/off control circuit of claim 1, wherein:
the second semiconductor switching circuit further comprises a fifth resistor and a sixth resistor;
a first terminal of the fifth resistor is connected to the first terminal of the second semiconductor switching element, and a second terminal of the fifth resistor is connected to the second terminal of the first semiconductor switching element; and
a first terminal of the sixth resistor is connected to the second terminal of the fifth resistor, and a second terminal of the sixth resistor is connected to a third terminal of the second semiconductor switching element.

4. The power on/off control circuit of claim 2, wherein:
the holding circuit comprises a second diode and a seventh resistor;
a positive terminal of the second diode is connected to a first terminal of the seventh resistor, and a negative terminal of the second diode is connected to the second terminal of the fourth resistor; and
a second terminal of the seventh resistor is connected to the second terminal of the second semiconductor switching element.

5. The power on/off control circuit of claim 4, wherein:
the power on/off control circuit further comprises a power off detection circuit;
the switching element is connected to the power off detection circuit; and
when a duration for which the switching element is closed is greater than or equal to a preset duration, the power off detection circuit outputs a power off indication signal.

6. The power on/off control circuit of claim 5, wherein:
the power off detection circuit comprises a third semiconductor switching element having three terminals;
the switching element is connected to a first terminal of the third semiconductor switching element; and
when the duration for which the switching element is closed is greater than or equal to the preset duration, the third semiconductor switching element maintains an on state until the switching element is open, and the power off indication signal is output via a second terminal of the third semiconductor switching element.

7. The power on/off control circuit of claim 6, wherein:
the power off detection circuit further comprises an eighth resistor and a ninth resistor; and
the switching element is connected to a first terminal of the eighth resistor, a second terminal of the eighth resistor is connected to the first terminal of the third semiconductor switching element, the second terminal of the third semiconductor switching element is connected to a first terminal of the ninth resistor, and the power off indication signal is output via a second terminal of the ninth resistor.

8. The power on/off control circuit of claim 5, wherein:
the power on/off control circuit further comprises a power-down control circuit comprising a fourth semiconductor switching element having three terminals; and
a second terminal of the fourth semiconductor switching element is connected to the first terminal of the seventh resistor; and
when the fourth semiconductor switching element is turned on, the second semiconductor switching element is turned off, and a power-down signal is output via the second terminal of the second semiconductor switching element.

9. The power on/off control circuit of claim 8, wherein:
the power-down control circuit further comprises a tenth resistor; and
a first terminal of the tenth resistor is connected to the first terminal of the fourth semiconductor switching element; and
when the power off detection circuit stops outputting the power off indication signal, a power-down indication signal is received via a second terminal of the tenth resistor and causes the fourth semiconductor switching element to be turned on.

10. An electronic device, comprising the power on/off control circuit of claim 1.

11. A power on/off control circuit, comprising:
a switching element;
a first semiconductor switching circuit comprising a first semiconductor switching element having three terminals;
a second semiconductor switching circuit comprising a second semiconductor switching element having three terminals; and
a holding circuit;
wherein the switching element is connected to a first terminal of the first semiconductor switching element, and a second terminal of the first semiconductor switching element is connected to the second semiconductor switching circuit, and when the switching element is closed, the first semiconductor switching element is turned on;
wherein the second terminal of the first semiconductor switching element is connected to a first terminal of the second semiconductor switching element, and when the first semiconductor switching element is turned on, the second semiconductor switching element is turned on, and a power on signal is output via a second terminal of the second semiconductor switching element;

wherein the second semiconductor switching circuit further comprises a fifth resistor and a sixth resistor;

wherein a first terminal of the fifth resistor is connected to the first terminal of the second semiconductor switching element, and a second terminal of the fifth resistor is connected to the second terminal of the first semiconductor switching element; and wherein a first terminal of the sixth resistor is connected to the second terminal of the fifth resistor, and a second terminal of the sixth resistor is connected to a third terminal of the second semiconductor switching element.

* * * * *